United States Patent
Belcher et al.

[11] Patent Number: 5,587,090
[45] Date of Patent: Dec. 24, 1996

[54] MULTIPLE LEVEL MASK FOR PATTERNING OF CERAMIC MATERIALS

[75] Inventors: James F. Belcher, Plano; Steven N. Frank, McKinney; John P. Long, Garland; Jeaneé Jones, Plano, all of Tex.

[73] Assignee: Texas Instruments Incorporated, Dallas, Tex.

[21] Appl. No.: 222,146

[22] Filed: Apr. 4, 1994

[51] Int. Cl.$^6$ ............................. B44C 1/22; C03C 15/00
[52] U.S. Cl. ................. 216/17; 216/47; 216/66; 430/316; 430/317; 430/320; 430/312; 437/3; 437/180; 156/643.1; 156/644.1; 156/651.1; 156/661.11
[58] Field of Search ........................ 156/643, 644, 156/648, 651, 657, 659.1, 661.1, 663, 667, 643.1, 644.1, 648.1, 651.1, 652.1, 659.1, 661.11; 437/3, 5, 180, 974; 430/311, 312, 313, 316, 317, 319, 320, 323, 329; 216/17, 19, 47, 20, 66

[56] References Cited

U.S. PATENT DOCUMENTS

| | | | |
|---|---|---|---|
| 4,080,532 | 3/1978 | Hopper | 250/332 |
| 4,377,437 | 3/1983 | Taylor et al. | 156/643 |
| 4,437,969 | 3/1984 | Covington et al. | 204/403 |
| 4,589,952 | 5/1986 | Behringer et al. | 156/643 |
| 4,745,042 | 5/1988 | Sasago et al. | 430/312 |
| 4,745,278 | 5/1988 | Hanson | 250/338.2 |
| 4,792,681 | 12/1988 | Hanson | 250/338.2 |
| 4,808,682 | 2/1989 | Schwalm et al. | 430/311 |
| 4,815,199 | 3/1989 | Jenner et al. | 29/840 |
| 4,838,991 | 6/1989 | Cote et al. | 156/643.1 |
| 4,927,711 | 5/1990 | Ferrett | 437/3 |
| 5,126,231 | 6/1992 | Levy | 430/313 |
| 5,134,090 | 7/1992 | Bean et al. | 437/106 |
| 5,292,402 | 3/1994 | Abt et al. | 156/643.1 |
| 5,314,772 | 5/1994 | Kozicki et al. | 430/313 |
| 5,426,304 | 6/1995 | Belcher et al. | 250/332 |

OTHER PUBLICATIONS

Elliott, David J.; "Integrated Circuit Fabrication Technology" © 1982 pp. 363–367.

Thompson et al; "Introduction to Microlithography" ©1983 pp. 311–318 (ACS Series 219).

D. J. Warner, D. J. Pedder, J. S. Moody, and J. Burrage, "The Preparation and Performance of Reticulated Targets for the Pyroelectric Vidicon,"*Ferroelectrics*, 33, 1981, pp. 249–253.

R. Watton, F. Ainger, S. Porter, D. Pedder and J. Gooding, "Technologies and Performance for Linear and Two Dimensional Pyroelectric Arrays", SPIE vol. 510, Infrared Technology X, 1984, pp. 139–149.

T. D. Flaim, G. A. Barner, and T. Brewer, "A Novel Release Layer syster for IC Processing", Brewer Science, Inc. Rolla, Missouri, presented at KTI IF Conference, Nov. 1989.

(List continued on next page.)

Primary Examiner—Janet C. Baxter
Assistant Examiner—Martin J. Angebranndt
Attorney, Agent, or Firm—Brian A. Carlson; James C. Kesterson; Richard L. Donaldson

[57] ABSTRACT

A novel multiple level mask (e.g. tri-level mask 36) process for masking achieves a desired thick mask with substantially vertical walls and thus improves the ion milling process of ceramic materials (e.g. BST). An embodiment of the present invention is a microelectronic structure comprising a ceramic substrate, an ion mill mask layer (e.g. photoresist 42) overlaying the substrate, a dry-etch-selective mask layer (e.g. TiW 40) overlaying the ion mill mask layer, the dry-etch-selective mask layer comprising a different material than the ion mill mask layer, a top photosensitive layer (38) overlaying the dry-etch-selective mask layer, the top photosensitive layer comprising a different material than the dry-etch-selective mask layer, and a predetermined pattern formed in the top photosensitive layer, the dry-etch-selective mask layer and the ion mill mask layer. The predetermined pattern has substantially vertical walls in the ion mill mask layer.

12 Claims, 3 Drawing Sheets

OTHER PUBLICATIONS

C. Hanson, H. Beratan, R. Owen, and K. Sweetser, "Low-Cost Uncooled Focal Plane Array Technology", Texas Instruments Incorporated, DSEG, presented at IRIS Specialty Group on Infrared Detectors, Bedford, MA, Jul. 14, 1993.

C. Hanson "Uncooled Thermal Imaging at Texas Instruments,", SPIE 1993, Inernational Symposium on Optics, Imaging and Instrumentation, Infrared Technology XIX, San Diego, Jul. 14, 1993.

H. Kaufman, R. Robinson, W. Hughes, "Characteristics, Capabilities, and Applications Broad–Beam Sources", Commonwealth Scientific Corporation, Alexandria, Virginia, 1987.

R. Watton, "Ferroelectrics for Infrared Detection and Imaging" *ISAF '86, Proceedings of the Sixth IEEE International Symposium on Applications of Ferroelectrics,* Jun., 1986.

MULTIPLE LEVEL MASK FOR PATTERNING OF CERAMIC MATERIALS

CROSS-REFERENCE TO RELATED APPLICATIONS

The following related applications were filed concurrently with the instant application:

| Title | Inventors | Serial Number Filing status |
| --- | --- | --- |
| Dual Etching of Ceramic Materials | Owen, Belcher | D8/223,087, Pending |
| Etching of Ceramic Materials with an Elevated Thin Film | Belcher, Owen | D8/223,073, Pending |
| Dual Etching of Ceramic Materials with an Elevated Thin Film | Belcher, Owen | D8/223,088, Pending |
| Dual Etching of Cermaic Materials with a Thin Front Film | Belcher, Owen | D8/222,769, Pending |
| An Elevated Thin Film for Ceramic Materials | Belcher | D8/222,144, Pending |

FIELD OF INVENTION

This invention generally relates to etching of ceramic materials, and more specifically to a multiple level mask for patterning of ceramic materials.

BACKGROUND OF INVENTION

The novel IR devices and fabrication processes to be described are related to the types of IR detector arrays recorded in (1) U.S. Pat. No. 4,080,532, Hopper, March, 1978; (2) U.S. Pat. No. 4,745,278, Hanson, May, 1988; (3) U.S. Pat. No. 4,792,681, Hanson, December, 1988; and (4) "LOW-COST UNCOOLED FOCAL PLANE ARRAY TECHNOLOGY", by Hanson, Beratan, Owen and Sweetser, presented Aug. 17, 1993 at the IRIS Detector Specialty Review.

The physical requirements of uncooled arrays and a brief description of current fabrication processes will be presented to aid in the understanding of the improvements realized by the novel methods to be described.

An area imager may contain several hundred to tens of thousand individual picture elements (pixels). Each of these pixels consists of a capacitor (or resistor or another type of electronic element) that has a heat (IR intensity) sensitivity. Making use of the fact that the charge stored by a capacitor is proportional to the product of its terminal voltage and its capacitance, electronic circuitry can be attached to the two terminals of the capacitor based pixel to measure the intensity of the IR impinging on a specific pixel. Obstructions in the imaging field are removed and the electronic connections to these capacitors are simplified if one of the capacitor terminals is made common to all. Hundreds to tens of thousands of connections must still be made between the other isolated terminals of the capacitors and the electronic sensing circuitry. In addition, the pixel capacitors should be thermally isolated from each other while having one terminal connected to all the other common terminals.

The common connection to one side of the pixel capacitors consists of a front side thin film referred to as the optical coating. This may be a composite of a plurality of thin films which have been optimized with regard to IR transparency, IR absorbency, electrical conductivity, thermal resistivity, etc.. The thicker heat sensitive dielectric substrate in this case can be barium-strontium-titanate (BST) which is a ceramic perovskite material.

To leave the front side optical coating thin film electrically conducting while isolating the pixels thermally, one may etch deep trenches around the pixel capacitors in the BST substrate. The optical coating side of the device will be referred to as the front side.

SUMMARY OF THE INVENTION

A preferred embodiment of this invention comprises a novel planar surface, reticulated array of two-terminal heat sensitive capacitors which are fabricated from novel materials using unique methods of patterning.

Ion milling of the BST substrate is also preferred over other dry processing etching methods such as reactive ion etching, electron cyclotron resonance plasma etching and standard plasma etching because all would require undesired high temperatures to etch properly.

Ion milling can be performed from the back side to isolate pixels. However, it can be difficult to control this backside ion milling process accurately enough to prevent damage to the optical coating on the front side. Novel methods are described to effect the desired thermal isolation of the pixels without damage to the optical coating.

The novel fabrication method also provides for the convenient electrical and mechanical bonding of each of the massive number of pixel capacitors to an integrated circuit containing a massive array of sensing circuits.

As used herein, the term "multiple level", when used in reference to a mask, means a mask containing three or more layers of mask materials. As used herein, the term "ceramic" comprises materials normally referred to as ceramics (one or more metals in combination with a non-metal (e.g. perovskites, sapphire), and in addition other single or poly-crystalline oxides, nitrides and carbides (e.g. SiC), and diamond.

Ion milling through a thick or slow-etching ceramic material such as BST can be difficult, especially for a narrow etch in multiple directions. Most suitable mask materials provide poor etch selectivity for ceramic materials, since ceramic materials etch at a slower rate than mask materials. The etch rate between a mask and a ceramic material can vary from 1:1 to 10:1 and up to 15:1 or more, depending on the mask material and ceramic material, and on the ion incidence angle (generally 0°–60°, preferably 5°–10°). Etch rates for a specific material can also vary substantially for varying ion incidence angles (e.g. etching at 0° typically slows the etch rate down substantially compared to an angle of 5°–10°).

Organics such as photoresists and polyimides can be used as the mask material. These materials are easily deposited, exposed and developed, or etched to create acceptable patterns. However, the mask must be thicker (and preferably 2–3 times thicker) than the depth to be etched in the ceramic substrate. It has been found that it is very difficult to use a single layer mask to etch a ceramic substrate. Due to light scattering, etc., patterning a straight wall in photoresists using standard photo techniques can be difficult for the thick geometries required to last through an ion milling process. Generally, photolithography used in conjunction with thick photo-developable materials will yield a sloped wall. However, a vertical wall is generally desirable, since ion milling will generally transfer any wall slope to the etched material and will be exacerbated further during continued etching. (It may be possible to cause redeposition of etched material along the wall to hinder additional lateral etching.)

A novel multiple level mask process for masking achieves the desired thick mask with substantially vertical walls and thus improves the ion milling process of ceramic materials. A minimum of three layers is used for the mask, with each layer providing etch selectivity or resistance for the layer below it, with the bottom ion mill mask layer is made thicker than the trench to be etched in the ceramic substrate.

An embodiment of the present invention is a microelectronic structure comprising a ceramic substrate, an ion mill mask layer overlaying the substrate, a dry-etch-selective mask layer overlaying the ion mill mask layer, the dry-etch-selective mask layer comprising a different material than the ion mill mask layer, a top photosensitive layer overlaying the dry-etch-selective mask layer, the top photosensitive layer comprising a different material than the dry-etch-selective mask layer, and a predetermined pattern formed in the top photosensitive layer, the dry-etch-selective mask layer and the ion mill mask layer. The predetermined pattern has substantially vertical walls in the ion mill mask layer.

A method of forming an embodiment of the present invention comprises providing a ceramic substrate, forming an ion mill mask layer on the substrate, forming a dry-etch-selective mask layer on the ion mill mask layer, the dry-etch-selective mask layer comprising a different material than the ion mill mask layer, and forming a top photosensitive layer on the dry-etch-selective mask layer, the top photosensitive layer comprising a different material than the dry-etch-selective mask layer. The method further comprises forming a predetermined pattern in the top photosensitive layer using photolithography, forming the predetermined pattern in the dry-etch-selective mask layer using the top photosensitive layer as a first etch mask, forming the predetermined pattern in the ion mill mask layer using the dry-etch-selective mask layer as a second etch mask, the ion mill mask layer having substantially vertical walls, and etching the predetermined pattern in the ceramic substrate using the ion mill mask layer as a third etch mask. The substantially vertical walls of the ion mill mask layer allow substantially vertical walls and/or deep trenches to be formed in the ceramic substrate.

In some applications, ion milling hardens organics and makes them difficult to remove from the substrate once milling has completed. For example, parylene or polyimide will generally adhere to the substrate and can be difficult to remove. A lift-off layer (such as "PIRL", a trademark of Brewer Science, Inc.) or some other material that will not harden and increase adherence under lengthy milling can be deposited on the substrate prior to the application of the bottom ion mill mask layer resist. A suitable solvent/material that will dissolve or release the lift-off layer can be used after milling is complete. The lift-off material may or may not be needed depending upon the application; the residual parylene or organic mask may be ashed off or ion milled away after ion milling depending upon the application.

An additional embodiment of the present invention is a microelectronic structure comprising a semiconductor substrate, a first reticulated array of thermal isolation mesas disposed on the semiconductor substrate, a first plurality of interconnects disposed on the isolation mesas, a second plurality of thin electrical contacts bonded to the interconnects, a second reticulated array of ceramic islands disposed on the thin electrical contacts, and a substantially undamaged continuous optical coating layer disposed on a surface of the ceramic islands opposite the thin electrical contacts, wherein the optical coating layer electrically connects the ceramic islands. In yet another embodiment, the ceramic islands comprise a middle cross-sectional area between the optical coating layer and the electrical contacts that is greater than a first cross-sectional area proximate the optical coating layer, and is greater than a second cross-sectional area proximate the electrical contacts. The infrared sensitive ceramic islands can have reduced thermal mass and increased thermal responsivity due to the smaller first and second cross-sectional areas.

An additional method of forming an embodiment of the present invention comprises providing a ceramic substrate having a front side and a back side, and etching a first predetermined pattern partially into the front side of the substrate, thereby forming etch stop trenches having the first predetermined pattern. The method further comprises filling the etch stop trenches with an etch stop material, depositing a thin front layer on the front side of the substrate, thinning the ceramic substrate by mechanically polishing the back side of the ceramic substrate, depositing a thin electrical contact on the back side of the ceramic substrate, and etching a second predetermined pattern into the thin electrical contact and the back side of the substrate. The second predetermined pattern is substantially the same as the first predetermined pattern, and is substantially aligned with the etch stop trenches on the front side, thereby forming cavities extending down to and partially into the etch stop material, but not extending to the thin front layer. The method further comprises removing the etch stop material, thereby forming isolated islands of the ceramic substrate connected by the thin front layer, and bump bonding the thin electrical contact on the islands to a signal processing substrate. The thin front layer remains substantially undamaged, having not been exposed to the etching processes forming the first and second predetermined patterns.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
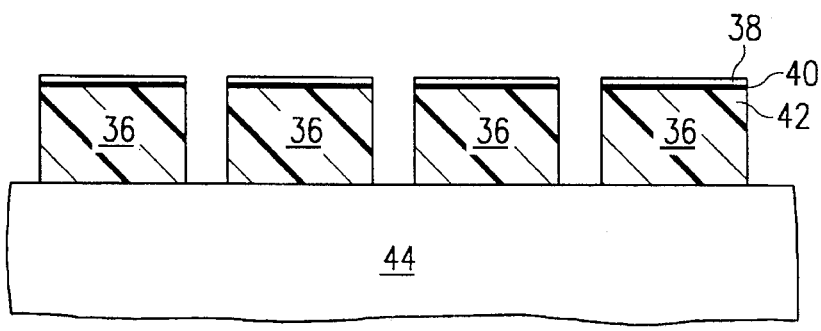
FIG. 1 illustrates the patterned tri-level photoresist exposing the substrate to be etched for the etch stop.

Some of the preferred embodiments will be presented with reference to FIGS. 1–11 and Tables 1 and 2. It should be understood that the drawings are for illustrative purposes and are not to scale or relative scale. In addition, only a few detectors are illustrated in the figures, but the present invention can be applied to any number of detectors in various configurations (e.g. single line or array).

Tables 1 and 2, below, provide an overview of some embodiments and the drawings.

TABLE 1

| ID# | Description | Material (dim) | Alternates |
|---|---|---|---|
| 36 | Multiple level mask | Tri-level etch mask (detailed below) | May use release layer under other layers |
| 38 | Top photo-sensitive layer | Photoresist 1.5 μm | 0.1–5.0 μm or more preferably 0.5–3.0 um |
| 40 | Dry-etch-selective mask layer | TiW 1000A | metals: 500–3000A or more preferably 900–1500A non-metals: 0.5–5.0 um SiO$_2$, spin on glass, Si$_3$N$_4$, cermets, other metals, oxides or nitrides |
| 42 | Ion mill mask layer | Photoresist 15 μm preferably | 0.4–30 um or more 12–16 um Polyimide, polyamide, parylene (CVD or spin on), epoxy, spin on glass, "PIRL," urethanes, acrylates Can be applied as single or multiple layers |
| 44 | Ceramic substrate | BST 0.06 cm | 0.01–0.25 cm May be a substrate, or a layer overlaying zero or more other layers on a substrate |
| 46 | Trench for etch stop | | 4–8 um |
| 48 | Frontside etch stop | Filler of organic or inorganic type | 4–8 um Photoresist, oxide, polyimide, parylene epoxy, nitride, "PIRL" |
| 50 | Planar surface | | |
| 52 | Optical coating | 3 layered | ¼ IR wavelength |
| 54 | Transparent coat | NiCr 50A | 25–100A other metals or metal compounds |
| 56 | ¼ wavelength separator coat | Parylene 1.4 μm | ¼ desired IR wavelength other organics (e.g. photoresist, polyimide, epoxy) |
| 58 | Electrical conducting coat | NiCr 1000A | 500–2000A other metals or metal compounds |
| 60 | Thinned Substrate | BST 18 μm | 1–200 μm |

TABLE 1-continued

| ID# | Description | Material (dim) | Alternates |
|---|---|---|---|
| 62 | Mechanical carrier | Glass | Silicon, quartz, ceramic |
| 64 | Adhesive | Wax | Epoxy |

TABLE 2

| ID# | Description | Material (dim) | Alternates |
|---|---|---|---|
| 66 | Backside electrical contact | Bonding Alloys | 4 layer composite of |
| 68 | | In 3 μm | 0.15–6 μm |
| 70 | | Au 0.1 μm | 0.05–0.15 μm |
| 72 | | NiCr 0.05 μm | 0.05–0.15 μm |
| 74 | | TiW 0.05 μm | 0.02–0.10 μm |
| 76 | Partially etched pixel isolation | Air | |
| 78 | Fully etched and cleaned pixel isolation | Vacuum | Air, inert gas |
| 80 | IC Contact mesa | Polyimide 12 um | 1–30 um Photoresist, parylene, epoxy |
| 82 | Ohmic connection | TiW 2000A | 100–10,000A Other metals, conductors |
| 84 | IC via | | |
| 86 | IC processor | Si or GaAs | |
| 90 | Lift-off layer | "PIRL" 1.5 um | 500A–6.0 um or more preferably 1.0–3.0 um Polyimide thinner epoxy photoresist, wax |

One of the preferred embodiments uses ion milling of the BST substrate from both the front and back. The front side ion milling forms a trench etch stop around the pixel and the backside ion milling completes the thermal isolation without damage to the front side optical coating.

Figure 2:
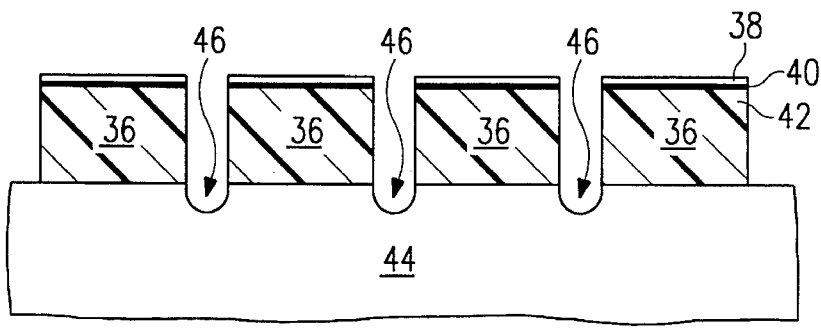
FIG. 2 indicates the etched trenches surrounding each pixel.

As shown in FIG. 1, a tri-level mask 36 is patterned on the BST substrate 44. This unique tri-level mask consists of a 1.5 μm layer of photoresist 38 over a 1000 Å (angstroms) layer of TiW 40 over a 15 μm thick layer of photoresist 42. The top layer of photoresist 38 is patterned by standard photolithographic means and used as an etch mask for the underlying titanium tungsten, TiW, 40. After the TiW 40 is patterned by plasma means using the gas CF$_4$, or equivalent, 40 is used as a mask for the underlying thick resist 42. The top level resist 38 may be partially or fully etched away at the same time the ion mill mask layer 42 is etched. Vertical sidewalls of 42 are achieved with a low pressure (<10 mTorr) dry etch. This vertical sidewall tri-level mask 36 is now used as an etch mask for ion milling the etch stop trenches 46. FIG. 2 shows the etch stop trenches 46 after patterning by ion milling. Any remaining top photoresist layer 38 and TiW layer 40 will normally be etched away during ion milling of BST substrate 44. Also, depending on the depth of trenches 46, a substantial portion of photoresist layer 42 will be etched away by the ion milling process.

Figure 3:
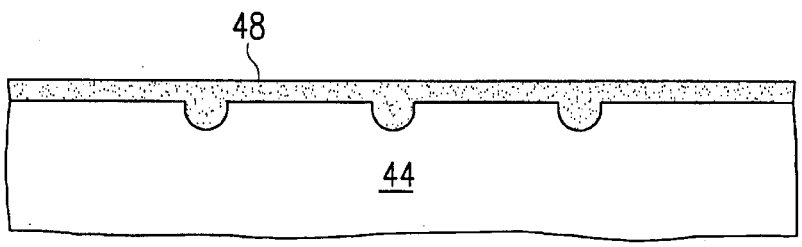
FIG. 3 depicts the addition of an etch stop material filling the etch stop trenches.
Figure 4:
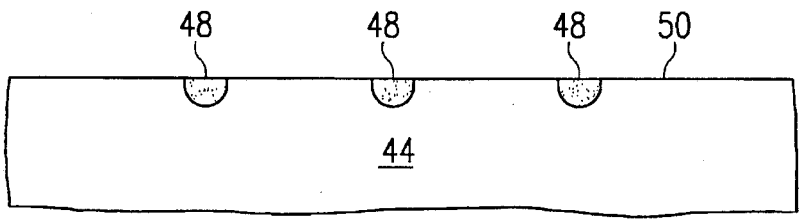
FIG. 4 shows the results of mechanically polishing and planarizing the surface of the front side of the substrate.

Trenches 46 are filled with parylene 48 as shown in FIG. 3. To remove any surface irregularities, the surface 50 of substrate 44 is mechanically polished as illustrated in FIG. 4.

Figure 5:
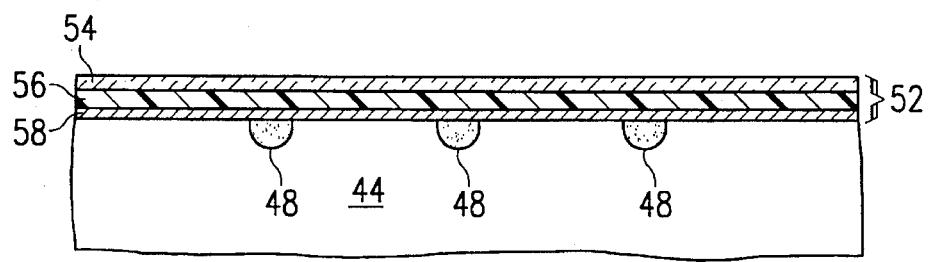
FIG. 5 illustrates (not to scale) the application of the optical coating.

An optical coating 52 is deposited on the polished surface 50 as shown in FIG. 5. This coating 52 consists of three layers. The top layer 54 is a very thin (35–100 Å) layer of metal such as nichrome (NiCr) that is semitransparent to the desired IR wavelength. The middle layer 56 can be parylene which, coupled with 56 optical properties, makes a thickness of an odd number of quarter wavelengths of the desired IR wavelength. The bottom layer 58 has a thickness of 500–2000 Å and may be NiCr. This layer 58 serves as a reflector for the ¼ wavelength IR filter, heat conductor to the underlying pixel capacitor and the common electrical conductor to all other pixels.

Figure 6:
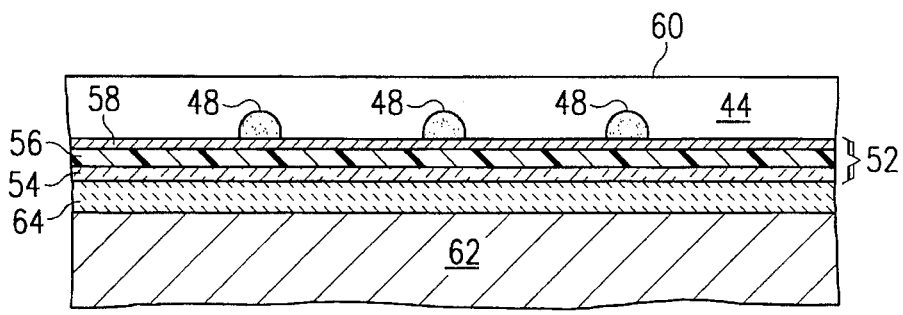
FIG. 6 indicates the mounting of the front side of the substrate to a mechanical carrier.

This ensemble is mounted front side down by an adhesive 64 such as wax to a mechanical carrier 62 as shown in FIG. 6. This is for the protection of the optical coating 52 while the substrate undergoes repeated handling and processing.

Figure 7:
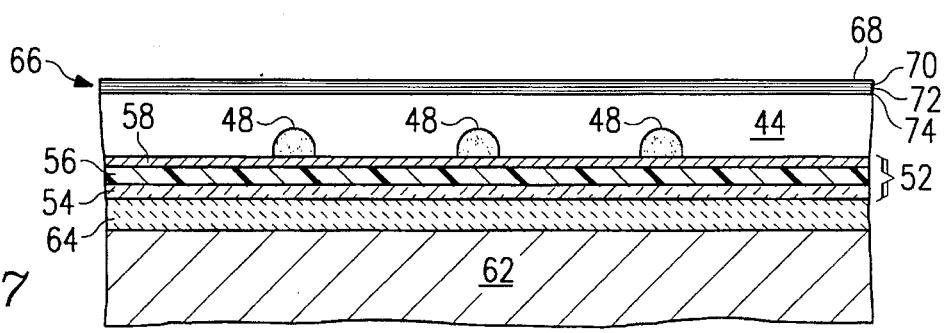
FIG. 7 illustrates the composite after the deposition of the electrical contact metals to the back side.

The substrate 44 is thinned by mechanical polishing and the backside ohmic contact metallic alloys 66 are now deposited as shown in FIG. 7. These layers comprising 66 will be described from the outermost toward the substrate 44. Layer 68 is indium (In) 1.5–6 μm thick to provide for bonding electrical contacts to an IC at a low temperature. Layer 70 is 500–2000 Å of gold, Au. Layer 72 is 500–2000 Å of NiCr and layer 74 is 250–1000 Å of TiW.

Figure 8:
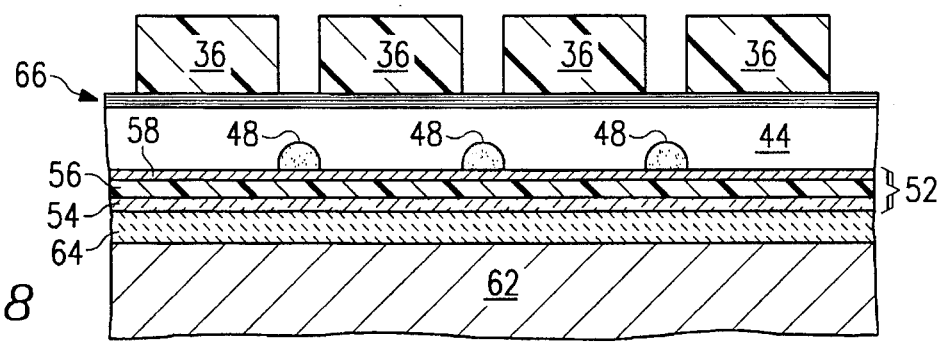
FIG. 8 shows the patterned tri-level photoresist with the openings aligned with the previously made etch stops.
Figure 9:
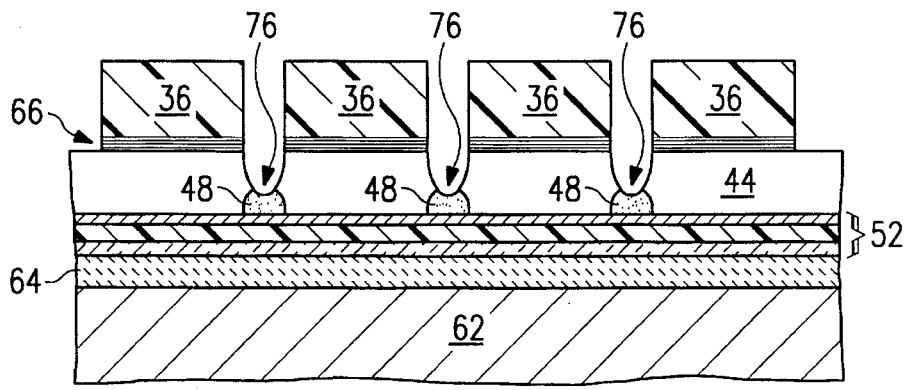
FIG. 9 depicts the ion milled isolation trenches partially completed.
Figure 10:
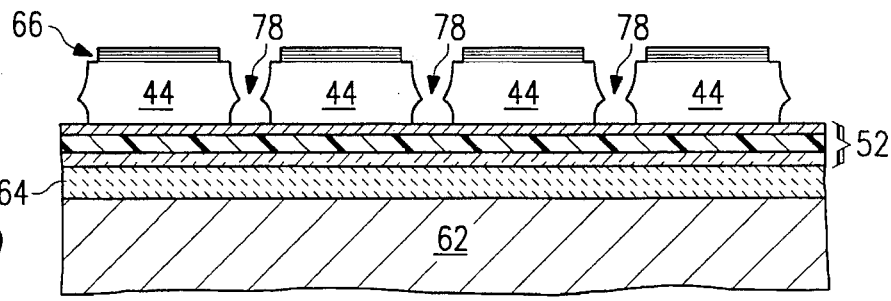
FIG. 10 shows the completed reticulated array of IR sensing capacitors, upside down, still mounted to the carrier.

To protect the contact metals 66 and expose the area to be ion milled for the thermal isolation barrier, the same tri-level mask 36 and its patterning process are repeated as shown in FIG. 8. The openings in the mask 36 are aligned with the previous etch stops 48. Ion milling now proceeds as shown in FIG. 9 until partially through the etch stop material 48. All the mask 36 and etch stop material 48 are now wet or dry etched from the substrate 44 as shown in FIG. 10 leaving the thermal isolation cavities 78 without damaging the optical coating 52.

Figure 11:
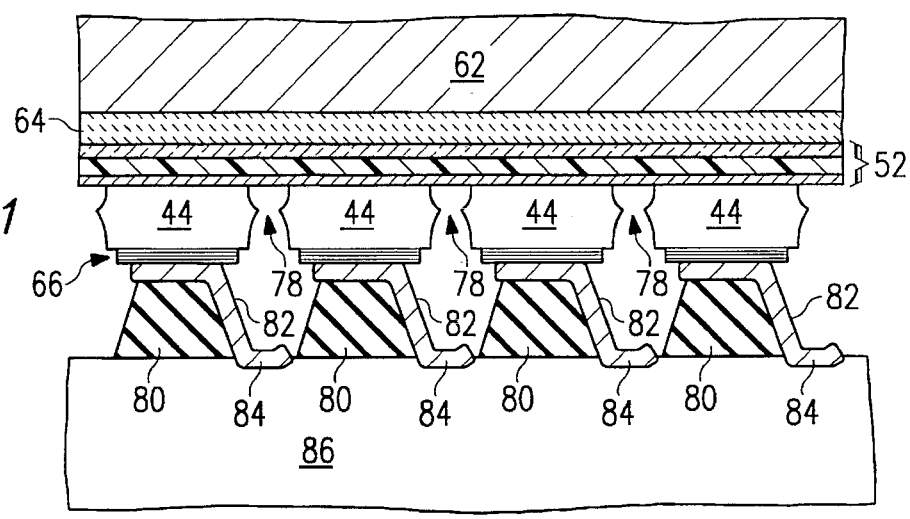
FIG. 11 shows the use of the carrier as a means of supporting the fragile IR sensor array while it is bonded to the planar IC containing the electronic sensing circuitry.

As shown in FIG. 11, the same mechanical carrier 62 is now used to support the fragile IR detector assembly and align the BST 44 mesas with IC mesas 80 such that a bonding material 82 may make electrical connections between each of the pixels by the pixel metallization layer 66 and the processing IC 86 via connection 84. An additional advantage of dual side etching is that dielectric 22 has lower thermal mass due to extra material being removed during the frontside etch which may provide improved thermal responsivity.

Figure 12:
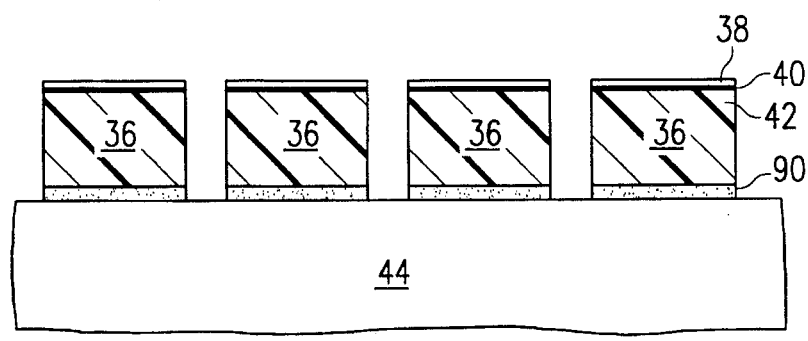
FIG. 12 illustrates the patterned tri-level photoresist with an additional release layer exposing the substrate to be etched for the etch stop.
Figure 13:
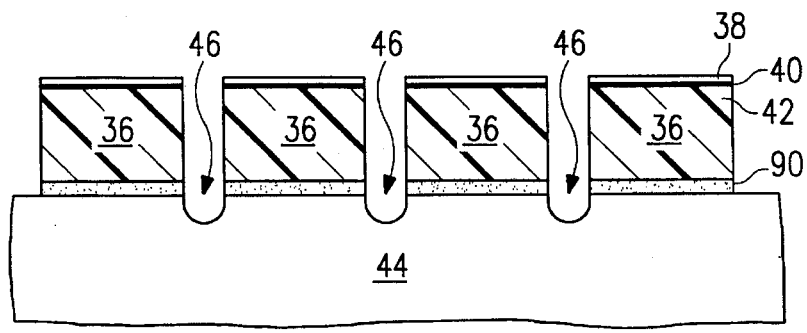
FIG. 13 indicates the etched trenches surrounding each pixel.

As an alternate embodiment, FIG. 12 again illustrates the tri-level mask 36 patterned on the BST substrate 44. In this embodiment, a release layer of "PIRL" 90 is used under the photoresist layer 42. For some applications, "PIRL" layer 90 (or some other suitable release layer) can ease the removal of the tri-level mask since it can be dissolved in a solvent to lift-off the layers above it. The tri-level mask is patterned as describe hereinabove, except that "PIRL" layer 90 is patterned when photoresist layer 42 is patterned. Alternatively, "PIRL" layer 90 may be patterned after photoresist layer 42. The vertical sidewall tri-level mask 36 is again used as an etch mask for ion milling the etch stop trenches 46. FIG. 13 shows the etch stop trenches 46 after patterning by ion milling. The patterns etched in the BST layer 44 may extend partially or completely through BST layer 44. The BST layer 44 may be a substrate, or a layer on a substrate or other layers.

An advantage of using parylene for ion mill mask layer 42 is that it can be chemical vapor deposited (CVD) as thick as required in one continuous application. When applying photoresists, polyimides or other spin on processes in thick layers (or multiple thin layers) the surface can skim over and hinder solvents from evaporating, causing stress fractures and bubbling. Photoresists and polyimides may also require a relatively high temperature bake (generally >90° C. and as much as 350° C.) for extended periods of time to cure. Also, spun on materials can form an edge bead at the edge of the wafer which is difficult to remove to achieve a planar surface, and can hinder subsequent processes.

The described novel methods produce a unique, rugged reticulated array of IR sensing pixels. While this invention has been described with reference to illustrative embodiments, this description is not intended to be construed in a limiting sense. There are also many variants and combinations of the materials and dimensions shown in these embodiments. As another example, several alternate organic and inorganic etch stop materials are listed in Table 1. The etch stop material can be many various materials such as but not limited to photoresist, oxide (e.g. $SiO_2$), polyimide, parylene, polyamide, epoxy, nitride (e.g. $Si_3N_4$), "PIRL", and combinations thereof. The deposition and removal of these materials vary but the function performed is the same. The removal of silicon nitride, $Si_3N_4$, could be performed by plasma etching in a Freon gas, $CF_4$. Parylene may be plasma etched using a different gas mixture. "PIRL" may be advantageously removed with a liquid solvent. In the dry removal of materials, reactive ion etching, plasma etching and electron cyclotron resonance plasma etching may often be interchanged without serious effect on the fabrication process. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:
   (a) providing a ceramic substrate;
   (b) chemical vapor depositing a parylene mask layer on said ceramic substrate;
   (c) forming a dry-etch-selective mask layer on said parylene mask layer, said dry-etch-selective mask layer comprising a different material than said parylene mask layer;
   (d) forming a top photosensitive layer on said dry-etch-selective mask layer, said top photosensitive layer comprising a different material than said dry-etch-selective mask layer;
   (e) forming a pattern in said top photosensitive layer using photolithography;
   (f) forming said pattern in said dry-etch-selective mask layer using said top photosensitive layer as a first etch mask:
   (g) forming said pattern in said parylene mask layer using said dry-etch-selective mask layer as a second etch mask, said parylene mask layer having vertical walls; and
   (h) ion milling said pattern in said ceramic substrate using said parylene mask layer as a third etch mask, whereby the vertical walls of the parylene mask layer allow vertical walls and/or deep trenches to be formed in the ceramic substrate.

2. The method according to claim 1, wherein said ceramic substrate is selected from the group consisting of: oxides, nitrides and carbides.

3. The method according to claim 1, wherein said ceramic substrate is barium strontium titanate.

4. The method according to claim 1, said method further comprising forming a lift-off layer on said ceramic substrate before said step of chemical vapor depositing said parylene mask layer.

5. The method according to claim 4, said method further comprising dissolving said lift-off layer after said step of etching said pattern in said ceramic substrate.

6. The method according to claim 4, wherein said lift-off layer is soluble polyimide.

7. The method according to claim 4, wherein said lift-off layer is selected from the group consisting of: polyimide thinner, epoxy, photoresist and wax.

8. The method according to claim 1, wherein said dry-etch-selective mask layer is a metal or metal compound.

9. The method according to claim 1, wherein said dry-etch-selective mask layer is TiW.

10. The method according to claim 1, wherein said dry-etch-selective mask layer is selected from the group consisting of: $SiO_2$, spin on glass, $Si_3N_4$, and cermets.

11. The method according to claim 1, wherein said pattern is a grid.

12. The method according to claim 1, said method further comprising removing said top photosensitive layer, said dry-etch-selective mask layer and said parylene mask layer from said ceramic substrate, after said step of etching said pattern in said ceramic substrate.

* * * * *